United States Patent
De-Michielis et al.

(10) Patent No.: US 11,189,688 B2
(45) Date of Patent: Nov. 30, 2021

(54) INSULATED GATE POWER SEMICONDUCTOR DEVICE AND METHOD FOR MANUFACTURING SUCH DEVICE

(71) Applicant: ABB Power Grids Switzerland AG, Baden (CH)

(72) Inventors: Luca De-Michielis, Aarau (CH); Munaf Rahimo, Gänsbrunnen (CH); Chiara Corvasce, Bergdietikon (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 17/285,415

(22) PCT Filed: Sep. 13, 2019

(86) PCT No.: PCT/EP2019/074531
§ 371 (c)(1),
(2) Date: Apr. 14, 2021

(87) PCT Pub. No.: WO2020/078626
PCT Pub. Date: Apr. 23, 2020

(65) Prior Publication Data
US 2021/0320170 A1 Oct. 14, 2021

(30) Foreign Application Priority Data
Oct. 18, 2018 (EP) ..................... 18201282

(51) Int. Cl.
*H01L 29/06* (2006.01)
*H01L 29/78* (2006.01)
(Continued)

(52) U.S. Cl.
CPC .... *H01L 29/0623* (2013.01); *H01L 21/26513* (2013.01); *H01L 29/66348* (2013.01);
(Continued)

(58) Field of Classification Search
CPC .......... H01L 29/0623; H01L 29/66348; H01L 29/66734; H01L 29/7397; H01L 29/7813; H01L 21/26513
(Continued)

(56) References Cited

U.S. PATENT DOCUMENTS

| | | |
|---|---|---|
| 2017/0018642 A1 | 1/2017 | Kagata et al. |
| 2017/0323959 A1* | 11/2017 | De-Michielis ...... H01L 29/0623 |
| 2019/0123172 A1* | 4/2019 | De-Michielis .... H01L 29/66348 |

FOREIGN PATENT DOCUMENTS

| | | |
|---|---|---|
| EP | 2763178 A1 | 8/2014 |
| JP | 2007266133 A | 10/2007 |
| WO | 2012113818 A2 | 8/2012 |

* cited by examiner

Primary Examiner — Igwe U Anya
(74) Attorney, Agent, or Firm — Slater Matsil, LLP (57) ABSTRACT

An insulated gate power semiconductor device (1a), comprises in an order from a first main side (20) towards a second main side (27) opposite to the first main side (20) a first conductivity type source layer (3), a second conductivity type base layer (4), a first conductivity type enhancement layer (6) and a first conductivity type drift layer (5). The insulated gate power semiconductor device (1a) further comprises two neighbouring trench gate electrodes (7) to form a vertical MOS cell sandwiched between the two neighbouring trench gate electrodes (7). At least a portion of a second conductivity type protection layer (8a) is arranged in an area between the two neighbouring trench gate electrodes (7), wherein the protection layer (8a) is separated from the gate insulating layer (72) by a first conductivity type channel layer (60a; 60b) extending along the gate insulating layer (72).

13 Claims, 8 Drawing Sheets

(51) Int. Cl.
*H01L 21/265* (2006.01)
*H01L 29/66* (2006.01)
*H01L 29/739* (2006.01)

(52) U.S. Cl.
CPC .... *H01L 29/66734* (2013.01); *H01L 29/7397* (2013.01); *H01L 29/7813* (2013.01)

(58) Field of Classification Search
USPC ......................................................... 257/139
See application file for complete search history.

INSULATED GATE POWER SEMICONDUCTOR DEVICE AND METHOD FOR MANUFACTURING SUCH DEVICE

CROSS-REFERENCE TO RELATED APPLICATIONS

This application is a national stage application of International Application No. PCT/EP2019/074531, filed on Sep. 13, 2019, which claims priority to European Patent Application No. 18201282.3, filed on Oct. 18, 2018, which applications are hereby incorporated herein by reference.

DESCRIPTION

Field of the Invention

The invention relates to the field of power electronics, and more particularly to an insulated gate power semiconductor device according to the preamble of claim 1 and to a method for manufacturing such an insulated gate power semiconductor device.

Background of the Invention

In the prior art there are known several vertical power semiconductor devices which make use of a vertical metal oxide semiconductor (MOS) cell design, such as a trench insulated gate bipolar transistor (IGBT), or a trench power MOSFET (metal oxide semiconductor field effect transistor).

Figure 10:
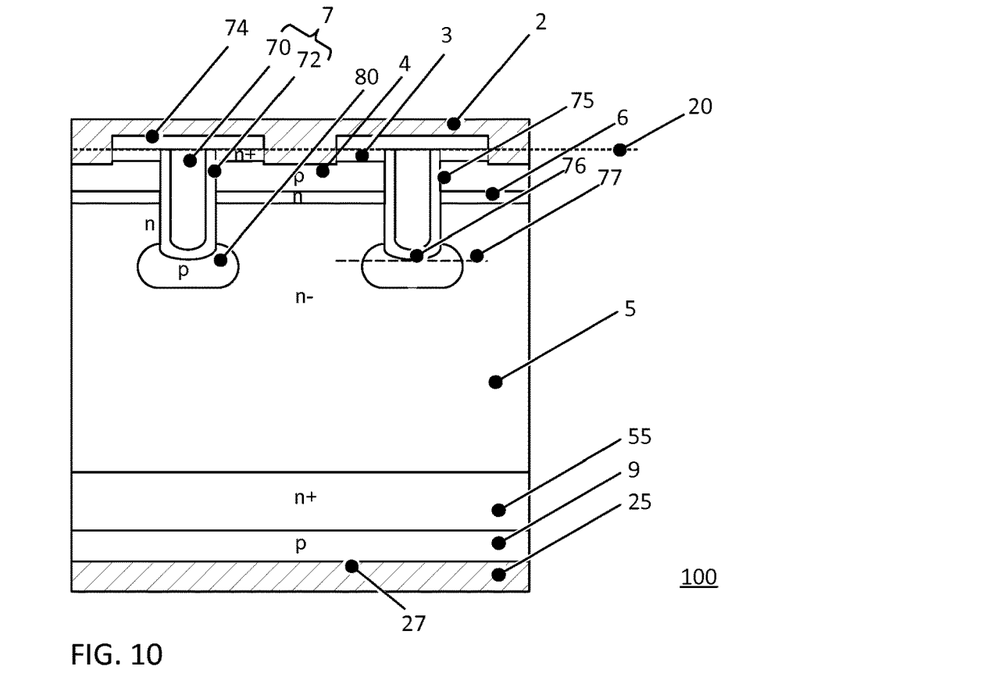
FIG. 10 shows a known trench IGBT having p-type protection layer regions located at a bottom of trench gate electrodes, respectively.

From EP 0 795 911 A2 there is known a trench IGBT 100 as shown in FIG. 10. This known trench IGBT 100 comprises an active MOS cell, in which the following layers are arranged from a first main side 20 to a second main side 27 opposite to the first main side 20: an (n+) doped source layer 3, a p doped base layer 4, an n doped enhancement layer 6 and an (n−) doped drift layer 5. Two trench gate electrodes 7 are arranged adjacent to the first main side 20, each trench gate electrode 7 including an electrically conductive gate layer 70, which is separated from the doped layers (i.e. the drift layer 5, the enhancement layer 6, the base layer 4 and the source layer 3) by a gate insulating layer 72 (e.g. a gate insulating layer). Towards the second main side 27, the trench IGBT 100 further comprises an (n+) doped buffer layer 55 and a p doped collector layer 9. With the buffer layer 55 separating the collector layer 9 from the drift layer 5, the trench IGBT 100 as shown in FIG. 10 has a punch-through (PT) configuration. Throughout the specification, if a layer in a specific device is described to be (n+) doped, it is considered to have higher doping concentration than a layer in this specific device which is described to be n doped. Likewise, if a layer in a specific device is described to be (n−) doped, it is considered to have lower doping concentration than a layer in this specific device which is described to be n doped.

A first main electrode 2, which forms the emitter electrode of the trench IGBT 100, is arranged on the first main side 20 to electrically contact both, the source layer 3 and the base layer 4. On the second main side 27 there is arranged a second main electrode 25, which forms the collector electrode of the trench IGBT 100 and which electrically contacts the collector layer 9.

A top gate insulating layer 74 is arranged between the gate layer 70 and the first main electrode 2 to electrically insulate the gate layer 70 from the first main electrode 2. The trench gate electrode 7 extends from the first main side 20 up to a trench depth 77, at which a bottom 76 of the trench gate electrode 7 is arranged. The trench gate electrode 7 has lateral sides 75 extending from the bottom 76 to the first main side 20.

The enhancement layer 6, which has a higher doping concentration than the drift layer 5, allows for a reduction of an on-state voltage by increasing the plasma concentration. Lowering the on-state voltage means to lower also the on state losses. The reduction of the on-state voltage by increasing the plasma concentration is more pronounced for larger enhancement layer doping concentrations.

However, on the other side, for larger enhancement layer doping concentrations, the safe operating area (SOA), in particular the turn-off SOA or reverse blocking SOA (RB-SOA), becomes worse and the breakdown voltage, which the IGBT is able to sustain, decreases significantly. In addition, the enhancement layer is also exacerbating the impact ionization effect, i.e. the avalanche generation of carriers. This phenomena of avalanche generation becomes even more severe during turn-off of the trench IGBT 100, where it is known as dynamic avalanche. The maximum avalanche energy is generated after turn-off and diminishes after a few micro seconds. Avalanche generation of hot carriers having high kinetic energies is in particular very critical at the bottom 76 of the trench gate electrode 7 and also at a location, at which the enhancement layer 6 touches the gate insulating layer 72, because hot carriers are injected into the gate insulating layer 72 and lead to a damage of the gate insulating layer 72.

In order to be able to exploit the on-state benefits of a highly doped enhancement layer, without suffering from the drawbacks of reduced blocking performance and reduced RBSOA, p doped protection layer regions 80 (also referred to as "protection pillows") have been suggested in EP 0 795 911 A2 as shown in FIG. 10. The p doped protection layer regions 80 have the effect to reduce the electric field strength at the bottom 76 of the trench gate electrodes 7, so that the RBSOA and breakdown voltage is improved. The introduction of p doped protection layer regions 80 at the trench bottoms improves the device robustness, being able to postpone the onset of the breakdown mechanism, but the p doped protection layer regions 80 are not able to redeem the inherent weakness of a trench IGBT device sufficiently where the impact ionization is caused by an increased enhancement layer doping concentration above $2.5 \cdot 10^{16}$ cm$^{-3}$.

For moderate doping levels of the enhancement layer 6, namely for doping concentrations of the enhancement layer 6 below about $2.5 \cdot 10^{16}$ cm$^{-3}$ the impact ionization effect or avalanche generation, responsible for the detrimental degradation of the trench IGBT 100, is taking place mainly at the bottom 76 of the trench gate electrodes 7. However, in a device with an increased enhancement doping concentration above $2.5 \cdot 10^{16}$ cm$^{-3}$, the avalanche generation becomes more and more significant also at the interface between the base layer 4 and the enhancement layer 6 close to the gate insulating layer 72.

Avalanche generation of hot carriers near the interface between the enhancement layer 6 and the gate insulating layer 72 potentially translates in unwanted drawbacks such as hot carrier injection into the gate insulating layer 72 with consequent threshold voltage instabilities. Eventually, this results in a degraded dynamic avalanche robustness, and such negative effect is even more exacerbated under hard switching conditions.

Figure 11:
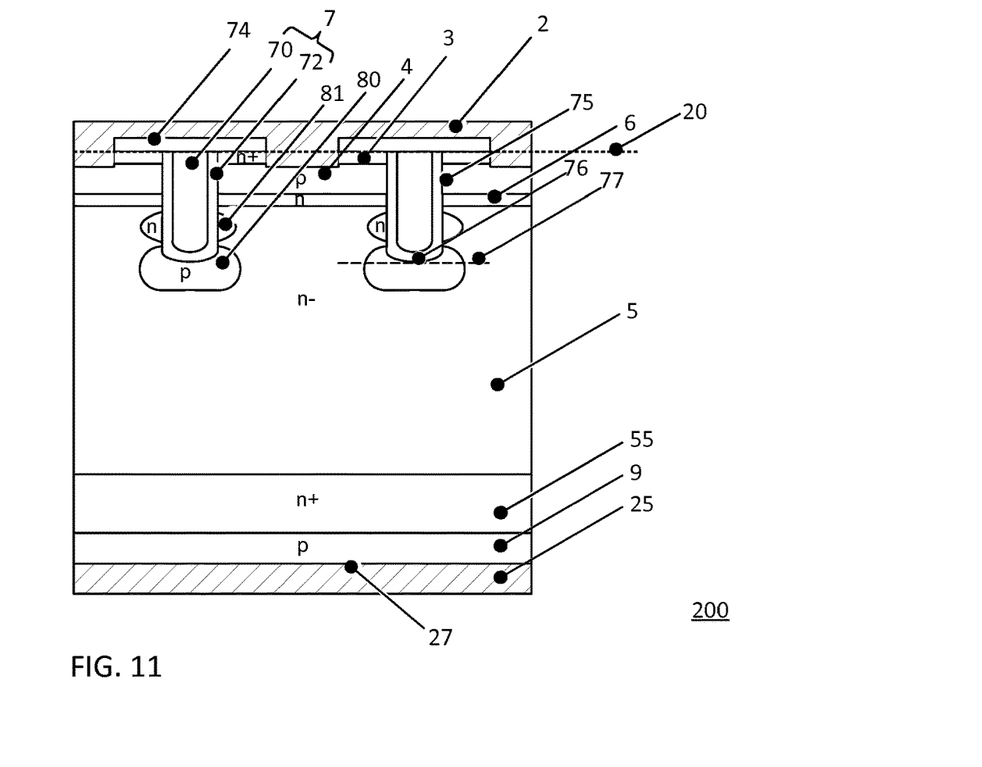
FIG. 11 shows another known trench IGBT having p-type first protection layer regions located at a bottom of trench gate electrodes and having in addition n-type second protection layer regions.

From EP 3 251 153 B1 it is known a trench IGBT 200 as shown in FIG. 11 and a method for manufacturing the same.

The trench IGBT 200 is similar to the trench IGBT 100 shown in FIG. 10. Compared to the trench IGBT 100 shown in FIG. 10 the trench IGBT 200 disclosed in EP 3 251 153 B1 has in addition to the p doped first protection layer regions 80 at the bottom 76 of the trench gate electrodes 7 n doped second protection layer regions 81, which have a higher doping concentration than that of the drift layer 5 and which encircle the trench gate electrodes 7 respectively at its lateral side 75 at a vertical position between the enhancement layer 6 and the first protection layer region 80. The n doped second protection layer regions 81 act as a sort of additional enhancement layer and to provide the benefits of plasma enhancement without the drawbacks of premature avalanche generation and hot carrier injection into the gate insulating layer 72, as it could happen in a trench IGBT 100 as shown in FIG. 10 with increased doping concentration of the enhancement layer 6. The role of the p doped first protection layer regions 80 is to protect the second protection layer regions 81 from the incoming electric field, thereby delaying the onset of impact ionization and increasing in this way the robustness of the device. With the additional second protection layer regions 81 plasma concentration can be increased, which means reduced on-state losses, without the drawbacks of an enhancement layer having an increased doping concentration.

The manufacturing method for the trench IGBT 200 disclosed in EP 3 251 153 B1 is relatively complex as it requires to form a trench recess for the trench gate electrode 7 in two separate process steps with another process step for creating the second protection layer regions 81 between these two separate process steps. Further, despite using the first and second protection layer regions 80 and 81 avalanche generation of carriers is still relatively high, especially at the interface between enhancement layer 6 and the base layer 4 close to the gate insulating layer 72, and breakdown voltage is therefore still relatively low in the trench IGBT 200 of the prior art, while the on state losses are not at its optimum due to the limited enhancement layer doping concentration for which the n doped second protection layer regions 81 can compensate only to a certain degree.

In WO 2012/113818 A2 is disclosed an insulated gate bipolar device, which has layers of different conductivity types between an emitter electrode on an emitter side and a collector electrode on a collector side in the following order: a source region of a first conductivity type, a base layer of a second conductivity type, which contacts the emitter electrode in a contact area, an enhancement layer of the first conductivity type, a floating compensation layer of the second conductivity type having a compensation layer thickness tp, a drift layer of the first conductivity type having lower doping concentration than the enhancement layer and a collector layer of the second conductivity type. The compensation layer is arranged in a projection of the contact area between the enhancement layer and the drift layer, such that a channel between the enhancement layer and the drift layer is maintained. The enhancement layer has an enhancement layer thickness tn, which is measured in the same plane as the compensation layer thickness, and the following rule applies: Np·tp=k·Nn·tn, wherein Nn and Np are the doping concentrations of the enhancement layer and of the compensation layer, respectively, and k is a factor between 0.67 and 1.5.

In JP 2007 266133 A is disclosed a semiconductor device that is provided with an n-type drift region; an $n^+$-type carrier accumulating region contacting the drift region, a p-type body region contacting the carrier accumulating region; an $n^+$-type emitter region contacting the body region; and a trench gate electrode opposing the body region positioned between the drift region and the emitter region, and the carrier accumulating region via a gate insulating film. The semiconductor device is further provided with floating body regions. The floating body regions are formed in a region including one part of the carrier accumulating region.

In US 2017 018642 A1 it is described a semiconductor device that includes a first conductivity type region provided to at least one of a second conductivity type column region and a second conductivity type layer located on the second conductivity type column region. The first conductivity type region has a non-depletion layer region when a voltage between a first electrode and a second electrode is 0V. When the voltage between the first electrode and the second electrode is a predetermined voltage, a depletion layer formed on interfaces between a first conductivity type column region and the second conductivity type column region as well as the first conductivity type column region and the second conductivity type layer and a depletion layer formed between the first conductivity type region and an interface of a region provided with the first conductivity type region connect to each other.

In EP 2 763 178 A1 it is discussed an IGBT, which comprises an emitter region, a top body region that is formed below the emitter region, a floating region that is formed below the top body region, a bottom body region that is formed below the floating region, a trench, a gate insulating film that covers an inner face of the trench, and a gate electrode that is arranged inside the trench. When a distribution of a concentration of p-type impurities in the top body region and the floating region, which are located below the emitter region, is viewed along a thickness direction of a semiconductor substrate, the concentration of the p-type impurities decreases as a downward distance increases from an upper end of the top body region that is located below the emitter region, and assumes a local minimum value at a predetermined depth in the floating region.

SUMMARY OF THE INVENTION

It is an object of the invention to provide an insulated gate power semiconductor device, in which avalanche generation is reduced and/or shifted away from a gate insulating layer without increasing the on state losses.

The object of the invention is attained by an insulated gate power semiconductor device according to claim 1. Further developments of the invention are specified in the dependent claims.

The insulated gate power semiconductor device according to claim 1 has a protection layer of a second conductivity type which is arranged between two neighboring trench gate electrodes, by which protection layer the electric field lines can be shifted away from the trench gate electrodes to reduce the avalanche generation of hot carriers at the bottom of the trench gate electrode and from the interface between the enhancement layer and the base layer close to the gate insulating layer. The protection layer of the second conductivity type can efficiently protect the gate insulating layer from high electric fields and the channel layer of the a conductivity type different from the second conductivity type separating the protection layer from the gate insulating layer allows a quick removal of carriers by providing a pathway for carriers from the enhancement layer to the drift layer. In the insulated gate power semiconductor device of the invention no high avalanche generation can occur at the gate insulating layer.

The protection layer extends from the area between the two neighbouring trench gate electrodes to a region below the neighbouring trench gate electrodes, so that in an orthogonal projection onto a plane parallel to the first main side, the protection layer overlaps with the two neighbouring trench gate electrodes. Therein, "below the neighbouring trench gate electrodes" means a position on a side of the trench gate electrodes towards the second main side (i.e. between a trench bottom and the second main side) so that in orthogonal projection onto the first main side the protection layer overlaps with each one of the neighbouring trench gate electrodes. With such features the bottom of the neighbouring trench gate electrodes is especially protected from high electric fields during turn-off to thus prevent avalanche generation at the bottom of the neighbouring trench gate electrodes.

In an exemplary embodiment a maximum doping concentration of the protection layer is in a range from $5 \cdot 10^{15}$ cm$^{-3}$ to $1 \cdot 10^{17}$ cm$^{-3}$, exemplarily in a range from $5 \cdot 10^{15}$ cm$^{-3}$ to $5 \cdot 10^{16}$ cm$^{-3}$. Such doping concentration of the protection layer allows an efficient protection of the gate insulating layer from high electric fields during turn-off without any significant increase of the on-state voltage.

In an exemplary embodiment a maximum doping concentration of the enhancement layer is higher than the maximum doping concentration of the protection layer. A higher doping concentration of the enhancement layer allows a higher plasma concentration in the on-state which translates into a lower on-state voltage and lower on-state losses.

In an exemplary embodiment the first conductivity type is n-type and the second conductivity type is p-type.

In an exemplary embodiment a maximum doping concentration of the enhancement layer is in a range from $4 \cdot 10^{16}$ cm$^{-3}$ to $4 \cdot 10^{17}$ cm$^{-3}$, more exemplarily in a range from $1 \cdot 10^{17}$ cm$^{-3}$ to $4 \cdot 10^{17}$ cm$^{-3}$. With a relatively high maximum doping concentration in this range it is possible to obtain have a low on-state voltage while the blocking capability is high.

In an exemplary embodiment the area between the two neighbouring trench gate electrodes has, along a line parallel to the first main side and crossing the two neighbouring trench gate electrodes, a varied lateral doping profile, which has a maximum concentration of a second conductivity type dopant in a central area between the two neighbouring trench gate electrodes and which is decreasing from the maximum concentration to a minimum concentration of the second conductivity type dopant towards the two neighbouring trench gate electrodes, respectively. With such concentration profile of the second conductivity type dopant the reduction of the electrical field strength at the gate insulating layer is most efficient while the on-state voltage and the on-state losses can be kept at a minimum. Moreover, such concentration profile of the second conductivity type dopant allows to form the channel layer of the first conductivity type by overcompensation in an easy manner.

In exemplary embodiments the insulated gate power semiconductor device is an IGBT having a collector layer of the second conductivity type on the second main side or is a reverse conducting IGBT having alternatingly a collector layer of the second conductivity type and shorts of the first conductivity type on the second main side or is a MOSFET having a drain layer of the first conductivity type on the second main side.

In an exemplary embodiment the protection layer extends in a direction from the first main side towards a second main side from a first depth, which is less deep than a depth of the bottom of each one of the two neighbouring gate electrode, to a second depth, which is deeper than the depth of the bottom of each one of the two neighbouring gate electrode. In such exemplary embodiment the protection layer can most efficiently protect the gate insulating layer from high electric fields during turn-off of the device.

The object of the invention is also attained by a method according to claim 10.

In the method for manufacturing an insulated gate power semiconductor device according claim 10 the channel layer separating the protection layer from the gate insulating layer is formed by overcompensation due to the first dopant of the second conductivity type being diffused into the substrate and being segregated into the gate insulating layer during and after the step of forming a gate insulating layer. Therein, overcompensation means that the concentration of dopants of the second conductivity is overcompensated by the concentration of dopants of the first conductivity type (i.e. a concentration of dopants of the first conductivity type becomes higher than the concentration of dopants of the second conductivity type) in the area of channel layer. Such method for manufacturing an insulated gate power semiconductor device allows to form the channel layer reliably and with a low number of process steps. The low number of process steps results in a relatively short time required for performing the manufacturing method and in lower manufacturing costs, for example.

In an exemplary embodiment the substrate is made of silicon and the gate insulating layer is made of silicon oxide. Segregation of the (second conductivity type) first dopant takes place particularly efficient at the interface between silicon and silicon oxide.

In an exemplary embodiment the first dopant, which is used for forming the protection layer, is Boron. Boron has a high segregation coefficient and is particularly suitable for the segregation process employed in the manufacturing method of the invention.

In an exemplary embodiment the (first conductivity type) second dopant used for forming the enhancement layer and for overcompensating the first dopant in the area of the channel layer is Phosphorus. Using Phosphorus facilitates the overcompensation in the area of the channel layer during the manufacturing method of the invention.

In an exemplary embodiment the trench recess has a depth in a range from 2.5 μm to 10 μm.

In an exemplary embodiment during and after the step of forming a gate insulating layer a temperature of at least 900° C., exemplarily of at least 975° C., more exemplarily of at least 1050° C., is applied for at least one hour in total. When applying such high temperature for such long time the segregation of the first dopant is most efficient to reliably form the channel layer of the first conductivity type by overcompensation along the gate insulating layer.

BRIEF DESCRIPTION OF DRAWINGS

The subject matter of the invention will become apparent for the skilled person from the following detailed description of embodiments with reference to the attached drawings, in which.

The reference symbols used in the figures and their meanings are summarized in the list of reference symbols. Generally, alike or alike-functioning parts are given the same reference symbols. The described embodiment and examples shall not limit the scope of the invention as defined by the appended claims. Therein, the first to fourth examples do as such not fall under the scope of the claims but describe partial aspects of the invention and serve for a better understanding.

DETAILED DESCRIPTION OF PREFERRED EMBODIMENTS

Figure 1:
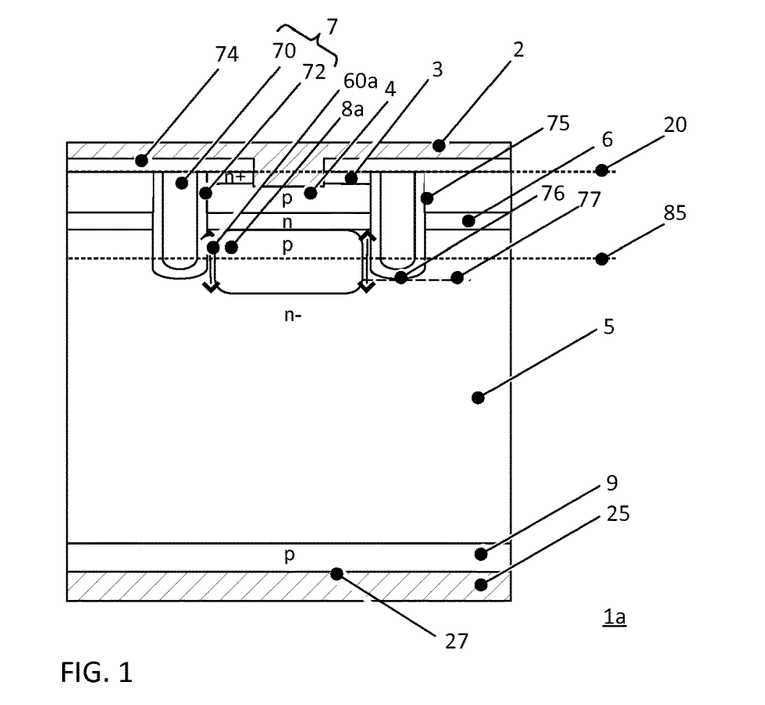
FIG. 1 shows an insulated gate power semiconductor device according to a first example (which does as such not fall under the scope of the claims)

FIG. 1 illustrates an insulated gate power semiconductor device according to a first example. The insulated gate power semiconductor device according to the first example is a trench IGBT 1a comprising in an order from a first main side 20 towards a second main side 27 opposite to the first main side 20 an (n+)-type source layer 3, a p-type base layer 4, an n-type enhancement layer 6, and a (n−)-type drift layer 5. The base layer 4 is in direct contact with the source layer 3 to form a first pn junction and the enhancement layer 6 is in direct contact with the base layer 4 to form a second pn junction. The trench IGBT 1a according to the first example further comprises two neighbouring trench gate electrodes 7, each of which is arranged at the first main side 20 and extends from the first main side 20 in a direction towards the second main side 27. Each of the two trench gate electrodes 7 has an electrically conductive gate layer 70, which is covered at a lateral side 75 and at a bottom 76 of the trench gate electrode 7 by a gate insulating layer 72, so that the gate insulating layer 72 separates the gate layer 70 from the doped layers, i.e. from the source layer 3, the base layer 4, the enhancement layer 6 and the drift layer 5. A first main electrode 2, which forms the emitter electrode of the trench IGBT 1a, is arranged on the first main side 20 to electrically contact both, the source layer 3 and the base layer 4. A top gate insulating layer 74 is arranged between the gate layer 70 and the first main electrode 2 to electrically insulate the gate layer 70 from the first main electrode 2. In other areas (of an orthogonal projection onto a plane parallel to the first main side 20) than an area laterally sandwiched between the two neighbouring trench gate electrodes 7, the top gate insulating 74 extends further on the base layer 4 to separate the first main electrode 2 from the base layer 4. With the above configuration a vertical MOS cell sandwiched between the two neighbouring trench gate electrodes 7 is formed.

Towards the second main side 27, the trench IGBT 1a further comprises a p-type collector layer 9. The trench IGBT 1a as shown in FIG. 1 has a non-punch-through (NPT) configuration, where the collector layer 9 is in direct contact with the drift layer 5. The electric field in blocking condition for a NPT configuration is triangular and stops within the drift layer 5 and the space charge region does not reach the collector layer 9. On the second main side 27 there is arranged a second main electrode 25, which forms the collector electrode of the trench IGBT 1a and which electrically contacts the collector layer 9.

The source layer 3, the base layer 4, the enhancement layer 6 and the drift layer 5 may be formed of silicon, and the gate insulating layer 7 may be formed of silicon oxide, for example.

The trench IGBT 1a further comprises a p-type protection layer 8a and an n-type channel layer 60a extending along and separating the p-type protection layer 8a from the gate insulating layer 72. A portion of the p-type protection layer 8a is formed in an area between the two neighbouring trench gate electrodes 7. The protection layer 8a extends, in a direction from the first main side 20 towards a second main side 27 from a first depth, which is less deep than a depth of the bottom 76 of each one of the two neighbouring gate electrode 7, to a second depth, which is deeper than the depth of the bottom 76 of each one of the two neighbouring gate electrodes 7. Therein, the depth of certain position means a distance of that position from the first main side 2, wherein the first main side 2 is defined as an outermost plane to which the doped semiconductor layers of the trench IGBT 1a, i.e. here the source layer 3 and the gate layer 70, extend on an emitter side of the trench IGBT 1a.

The doping concentration of the source layer 3 is higher than that of the base layer 4. Exemplary doping concentrations for the source layer 3 are higher than $1 \cdot 10^{'}$ cm$^{-3}$ and smaller than $1 \cdot 10^{21}$ cm$^{-3}$, exemplarily between $1 \cdot 10^{19}$ cm$^{-3}$ and $5 \cdot 10^{19}$ cm$^{-3}$. The drift layer 5 has a relatively low doping concentration. Exemplarily, the drift layer 5 has a constantly low doping concentration. Therein, the substantially constant doping concentration of the drift layer 5 means that the doping concentration is substantially homogeneous throughout the drift layer 5, however without excluding that fluctuations in the doping concentration within the drift layer being in the order of a factor of one to five may be possibly present due to e.g. a fluctuations in the epitaxial growth process. The final drift layer thickness and doping concentration is chosen due to the application needs. The final drift layer thickness and doping concentration is chosen due to the application needs. For devices above 600 V the doping concentration of the drift layer is exemplarily below $5·10^{14}$ cm$^{-3}$. For power devices (voltage above 600 V) an exemplary doping concentration of the drift layer 5 is between $2·10^{12}$ cm$^{-3}$ and $5·10^{14}$ cm$^{-3}$.

The structures as described above form an active MOS cell. The IGBT device may comprise only one active MOS cell as disclosed above, but it is also possible that the trench IGBT comprises at least two or more such active MOS cells, i.e. the active MOS cells can be repetitively arranged in one substrate.

A maximum doping concentration of the protection layer 8a is in a range from $5·10^{15}$ cm$^{-3}$ to $1·10^{17}$ cm$^{-3}$, exemplarily in a range from $5·10^{15}$ cm$^{-3}$ to $5·10^{16}$ cm$^{-3}$. A maximum doping concentration of the enhancement layer 6 may exemplarily be higher than the maximum doping concentration of the protection layer 8a, and is exemplarily in a range from $4·10^{16}$ cm$^{-3}$ to $4·10^{17}$ cm$^{-3}$, more exemplarily in a range from $1·10^{17}$ cm$^{-3}$ to $4·10^{17}$ cm$^{-3}$.

The protection layer 8a is arranged below the enhancement layer 6, i.e. on a side of the enhancement layer 6 towards the second main side 25. Boron is exemplarily used as a p-type dopant for the protection layer 8a. Phosphorus is exemplarily used as an n-type dopant for the enhancement layer 6. The protection layer 8a extends from the enhancement layer 6 in a direction from the first main side 20 towards the second main side 27, from a first depth, which is less deep than a depth 77 of the bottom 76 of each one of the two neighbouring gate electrode 7, to a second depth, which is deeper than the depth 77 of the bottom 76 of each one of the two neighbouring gate electrode 7. Therein, the depth shall be measured from the first main side 20, i.e. from the outermost plane to which the doped layers extend, which is in this case the n source layer 3 and the gate layer 70. In the first example, the protection layer 8a is limited, in an orthogonal projection onto a plane parallel to the first main side 20, to a region between the two neighbouring trench gate electrodes 7, i.e. in the orthogonal projection onto the plane parallel to the first main side 20 the protection layer 8a is not overlapping with the trench gate electrodes 7.

The area between the two neighbouring trench gate electrodes 7 may exemplarily have, along any line 85, which is below the enhancement layer 6, parallel to the first main side 20 and crossing the two neighbouring trench gate electrodes 7, a varied lateral p-type doping profile, which has a maximum concentration of a p-type dopant in a central area between the two neighbouring trench gate electrodes 7 and which is decreasing from the maximum concentration to a minimum concentration of the p-type dopant towards the two neighbouring trench gate electrodes 7, respectively. An n-type dopant may exemplarily have in the area between the two neighbouring trench gate electrodes 7, along the line 85, a concentration profile which is substantially constant. In the central area, the concentration of the n-type dopant may be less than the concentration of the p-type dopant and in areas adjacent to the two neighbouring gate electrodes 7 the concentration of the n-type dopant may respectively become higher than the concentration of the p-type dopant due to the lower concentration of the p-type dopant in these areas adjacent to the trench gate electrodes 7 to form the n-type channel layer 60a by overcompensation, i.e. by the n-type dopant overcompensating the p-type dopant.

Figure 2:
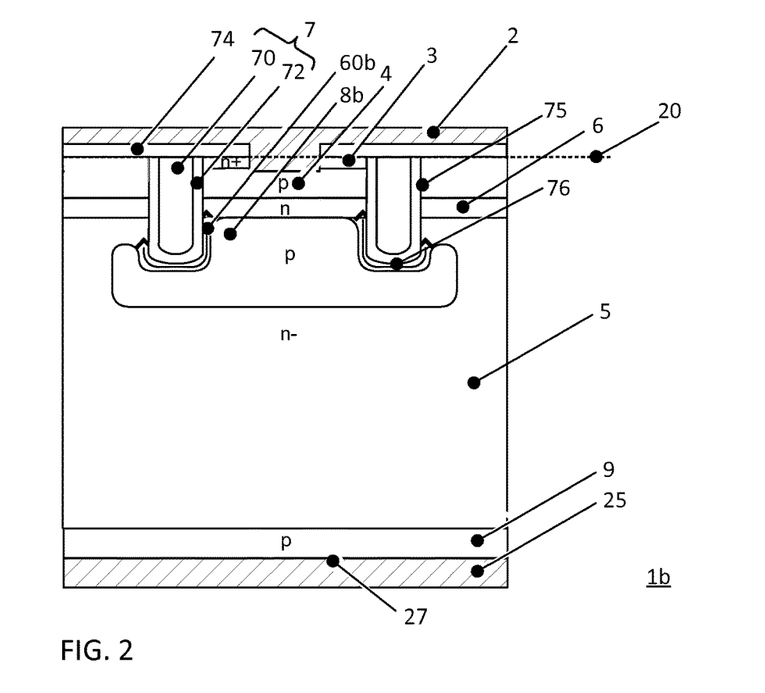
FIG. 2 shows an insulated gate power semiconductor device according to an embodiment of the claimed invention.

FIG. 2 shows an embodiment of the insulated gate power semiconductor device of the invention. Due to the many similarities between the first example and this embodiment, only differences between the first example and this embodiment will be described. With regard to all other features it is referred to the above discussion of the first example. In particular, elements having the same reference sign shall refer to elements having the same characteristics as the elements described above for the first example. The insulated gate power semiconductor device according to the embodiment is a trench IGBT 1b and differs from the trench IGBT 1a shown in FIG. 1 in that the protection layer 8b has another shape than the protection layer 8a of the first example. Specifically, different from the protection layer 8a of the first example, the protection layer 8b of the embodiment extends to a region below the neighbouring trench gate electrodes 7. Therein, a position "below the neighbouring trench gate electrodes" means a position on a side of the trench gate electrodes 7 towards the second main side 27 so that in orthogonal projection onto a plane parallel to the first main side 20 the protection layer 8b overlaps with each one of the neighbouring trench gate electrodes 7. Accordingly, the protection layer 8b has a smaller lateral extension between the two neighbouring trench gate electrodes 7 than the lateral distance of the trench gate electrodes 7 (smaller by two times the lateral width of the channel layer 60b in a lateral direction parallel to the first main side 20). In a region below the trench gate electrodes 7, the protection layer has a wider width so that the protection layer 8b spreads to a region below the trench gate electrodes 7, but is separated from it by the n channel layer 60b extending along the lateral sides 75 and the bottom 76 of the trench gate electrodes 7. As the channel layer 60a in the first example, also the channel layer 60b in the embodiment shown in FIG. 2 provides a continuous n-type region extending from the enhancement layer 6 to the drift layer 5.

Figure 3:
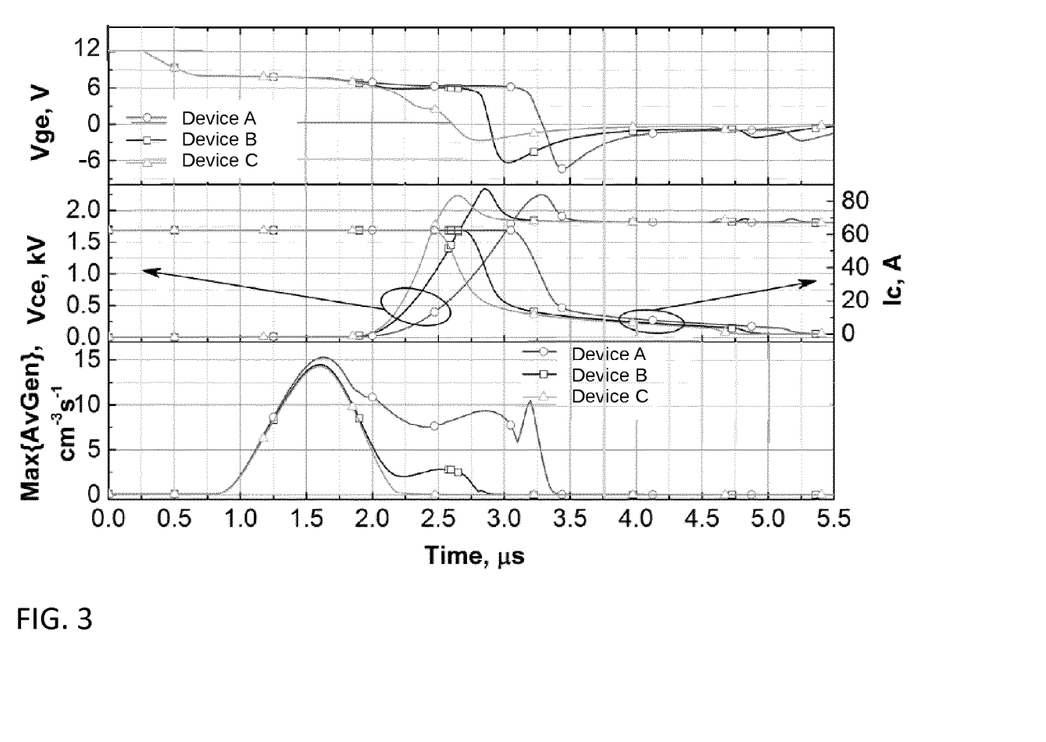
FIG. 3 illustrates a comparison of the turn-off behavior of the insulated gate power semiconductor device according to the first example (intra-trench protection layer), of the insulated gate power semiconductor device according to the embodiment (T-shape protection layer) and of a similar insulated gate power semiconductor device without the protection layer (reference)

FIG. 3 illustrates several graphs related to the turn-off behavior of a first trench IGBT without any protection layer ("Device A" in FIG. 3), of a second trench IGBT according to the first example ("Device B" in FIG. 3), and a third trench IGBT according to the embodiment discussed above with reference to FIG. 2 ("Device C" in FIG. 3). The first to third trench IGBTs ("Device A", "Device B" and "Device C") differ from each other only in the configuration of the protection layer, whereas the remaining configuration of the first to third trench IGBTs is the same with regard to all other aspects. FIG. 3 shows from top to bottom graphs of the gate-emitter voltage Vge, graphs of the collector-emitter voltage Vce (see the ordinate on the left) and graphs of the collector current (see the ordinate on the right), and graphs of the maximum avalanche generation Max{AvGen} as a function of the time during turn-off of the first to third trench IGBT, respectively.

As can be seen from FIG. 3, the gate-emitter voltage Vge decreases quicker for the third trench IGBT ("Device C" in FIG. 3) than for the second trench IGBT ("Device B" in FIG. 3) and decreases quicker for second trench IGBT ("Device B" in FIG. 3) than for the first trench IGBT ("Device A" in FIG. 3). Also a peak in the gate-emitter voltage Vge curve is less pronounced for the third trench IGBT compared to the first and second trench IGBT. A similar faster switching behavior can be observed for the collector-emitter voltage Vce and the collector current Ic. That means that the second and third trench IGBTs allow a faster turn-off compared to the first trench IGBT without protection layer. For the second and third trench IGBT according to embodiments of the invention, much less carriers are created leading to a drastically reduced avalanche generation. That means that for the second and third trench IGBT tremendously less carriers are created and these carriers are created during a shorter period leading to less injection, especially at the critical areas of the gate insulating layer 72 so that less heat is generated and in addition this heat is generated for a shorter time period.

The risk of hot carrier injection in the gate insulating layer 72 is reduced in trench IGBTs according to embodiments of the invention. As a result of the reduced risk of hot carrier injection at the gate insulating layer 72, especially at the interface between the enhancement layer 6 and gate insulating layer 72, and at the trench bottom 76, the device reliability is improved.

Figure 4:
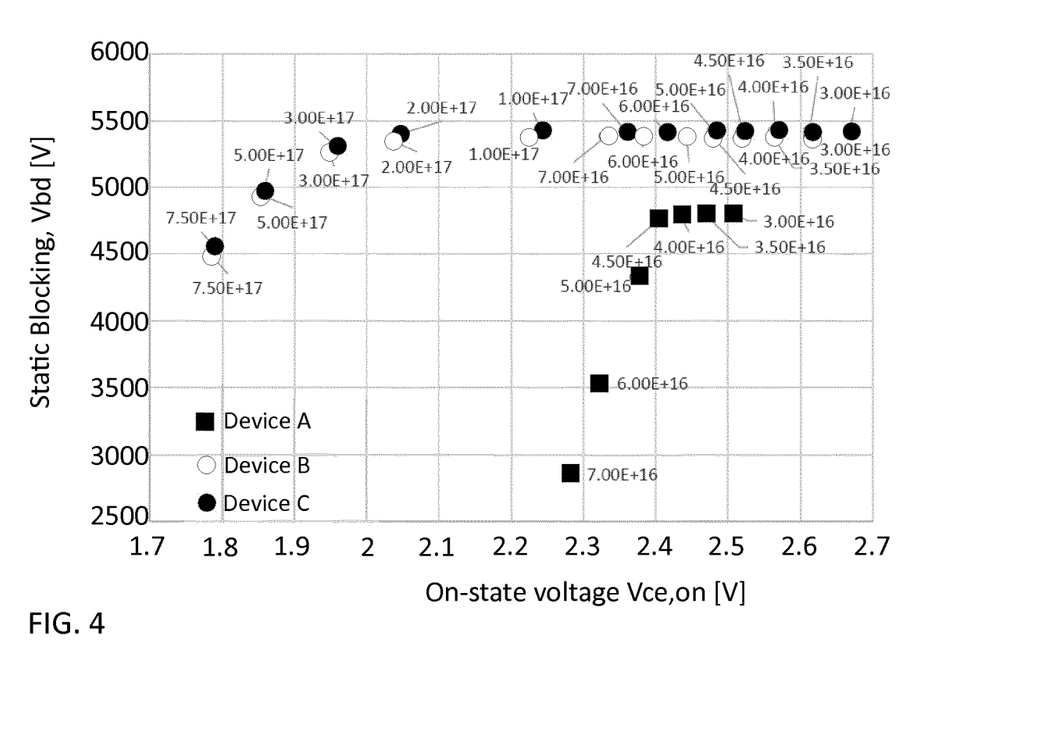
FIG. 4 illustrates blocking voltage and on-state voltage of the insulated gate power semiconductor device according to the first example (intra-trench protection layer), of the insulated gate power semiconductor device according to the embodiment (T-shape protection layer) and of a similar insulated gate power semiconductor device without the protection layer (reference) for different doping levels of the enhancement layer, respectively.

FIG. 4 illustrates blocking voltage Vbd and on-state voltage Vce,on of a first trench IGBT without any protection layer ("Device A" in FIG. 4), a second trench IGBT according to the first example ("Device B" in FIG. 4), and of a third trench IGBT according to the embodiment discussed above with reference to FIG. 2 ("Device C" in FIG. 4) for different doping concentrations of the enhancement layer 6, respectively. The first to third trench IGBTs ("Device A", "Device B" and "Device C" in FIG. 4) differed from each other only in the configuration of the protection layer 8a, 8b and in the doping concentration of the enhancement layer 6, whereas the remaining configuration of the first to third trench IGBTs was the same with regard to all other aspects. As can be seen from FIG. 4, when increasing the doping concentration of the enhancement layer from $3·10^{16}$ cm$^{-3}$ to $4·10^{16}$ cm$^{-3}$, the static blocking voltage or breakdown voltage Vbd does not significantly decrease in the second and third trench IGBT, whereas it decreases drastically for the first trench IGBT. In the second and third trench IGBT ("Device B" and "Device C" in FIG. 4), when increasing the doping concentration of the enhancement layer from $3·10^{16}$ cm$^{-3}$ to $4·10^{17}$ cm$^{-3}$, the breakdown voltage Vbd is decreased by less than 10%, whereas at the same time the on-state voltage Vce,on is decreased by more than 25%. Accordingly, in the second and third trench IGBTs, the on-state voltage Vce,on can be optimized (reduced) by increasing the doping concentration of the enhancement layer 6 to relatively high values up to $4·10^{17}$ cm$^{-3}$ (with only small reduction of the optimum breakdown voltage Vbd), whereas increasing the doping concentration of the enhancement layer 6 in the first trench IGBT without any protection layer beyond $5·10^{16}$ cm$^{-3}$ results in a drastic drop of the breakdown voltage Vbd.

Figure 5:
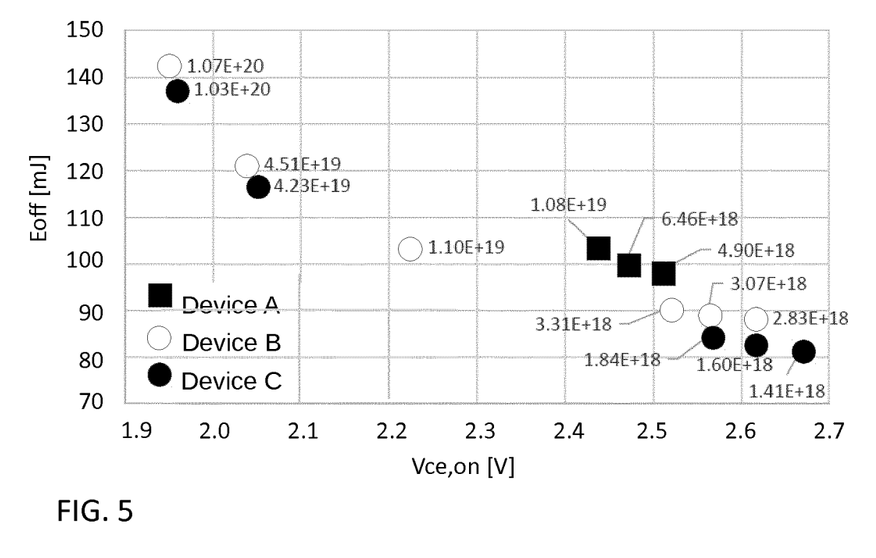
FIG. 5 shows the technology curve for the insulated gate power semiconductor device according to the first example (intra-trench protection layer), the insulated gate power semiconductor device according to the embodiment (T-shape protection layer) and a similar insulated gate power semiconductor device without the protection layer (reference)

FIG. 5 shows a technology curve for first trench IGBTs without any protection layer ("Device A" in FIG. 5), second trench IGBTs according to the first example ("Device B" in FIG. 5), and of third trench IGBTs according to the embodiment discussed above with reference to FIG. 2 ("Device C" in FIG. 5). The switching energy Eoff is shown versus Vce,on. In FIG. 5 there is also indicated the total number of electrons generated due to the dynamic avalanche mechanism during a single switching event. For prior art devices, less avalanche electrons are generated. For the same Vce,on the switching losses can be reduced by about 10% (i.e. only half of the numbers of electrons are generated in the second and third trench IGBTs). For a given switching loss, the on state voltage Vce,on can be reduced by about 0.2 V.

Figure 6:
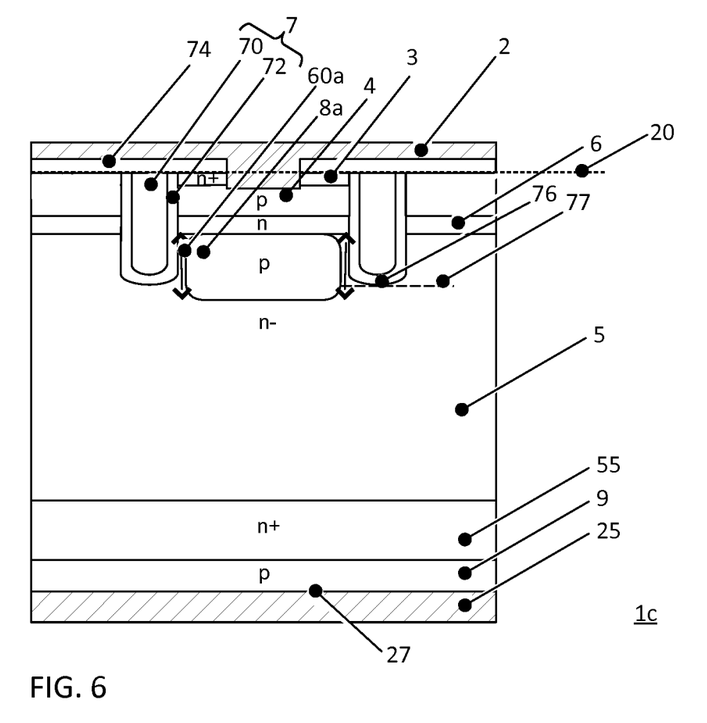
FIG. 6 shows an insulated gate power semiconductor device according to a second example (which does as such not fall under the scope of the claims)

In FIG. 6 it is shown an insulated gate power semiconductor device according to a second example, which is a trench IGBT 1c. Due to the many similarities between the first and the second example, only differences between these two examples will be described. With regard to all other features it is referred to the above discussion of the first example. In particular, elements having the same reference sign shall refer to same elements having the same characteristics as the elements described above for the first example. The trench IGBT 1c shown in FIG. 6 differs from the trench IGBT 1a in that it further comprises an (n+)-type buffer layer 55, which has a higher doping concentration than the drift layer 5. The buffer layer 55 is arranged on drift layer 5 towards the second main side 27 to separate the collector layer 9 from the drift layer 5. Accordingly, the trench IGBT 1c as shown in FIG. 6 has a punch-through (PT) configuration. The buffer layer 55 may either have a constant doping concentration profile, or may have a gradually rising doping concentration profile in a direction towards the second main side 27. In operation of the trench IGBT 1c at higher blocking voltages, the electric field at the interface between the drift layer 5 and buffer layer 55 will not have reached zero. Along a short distance in the buffer layer 55 it is then steeply decreased to zero due to the relatively high doping concentration thereof.

Figure 7:
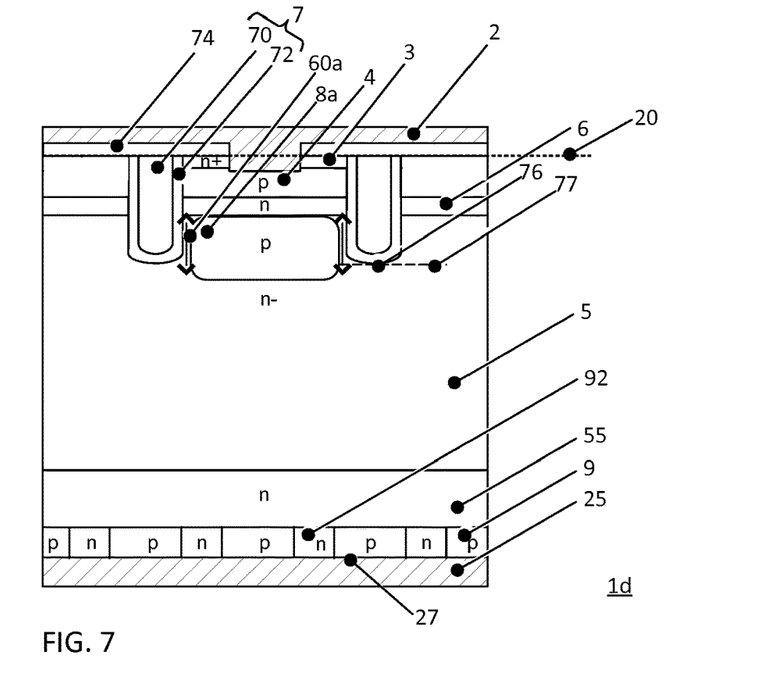
FIG. 7 shows an insulated gate power semiconductor device according to a third example (which does as such not fall under the scope of the claims)

In FIG. 7 it is shown an insulated gate power semiconductor device according to a third example, which is a reverse conducting (RC) trench IGBT 1d. Due to the many similarities between the second and the third example, only differences between these two examples will be described. With regard to all other features it is referred to the above discussion of the second example. In particular, elements having the same reference sign shall refer to the same elements having the same characteristics. The RC trench IGBT 1d of the third example differs from the trench IGBT 1a of the second example in that it comprises a plurality of n-type shorts 92 which are arranged on the second main side 27 to penetrate through the p doped collector layer 9 and electrically connect the n-type drift layer 5 to the second main electrode 25. Accordingly, the p doped collector layer 9 alternates with the n-type shorts 92 in a plane parallel to the second main side 27 as shown in FIG. 7. The buffer layer 55 has a higher doping concentration than the drift layer 5 and the shorts 92 have an even higher doping concentration than the buffer layer 55.

Figure 8:
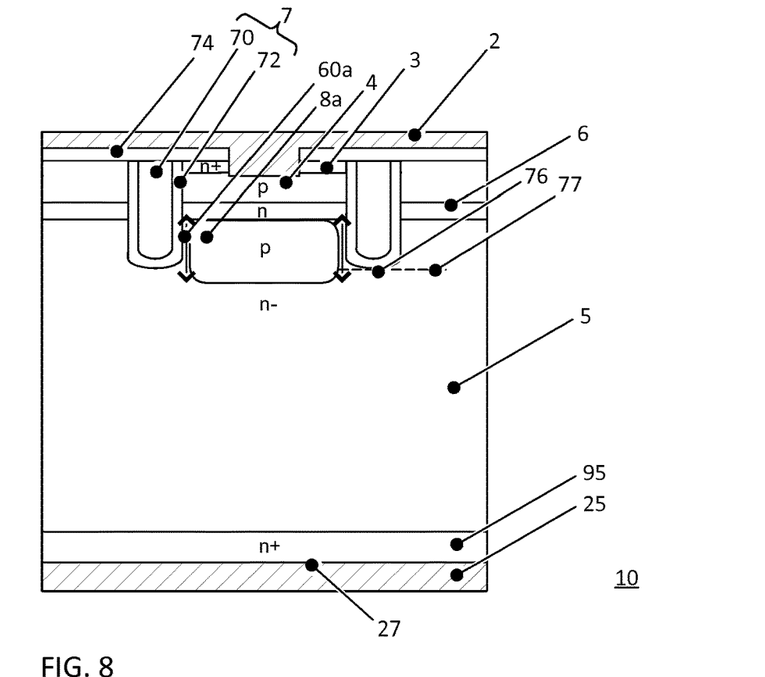
FIG. 8 shows an insulated gate power semiconductor device according to a fourth example (which does as such not fall under the scope of the claims)

FIG. 8 shows an insulated gate power semiconductor device according to a fourth example. Due to the many similarities between the first and the fourth example, only differences between these two examples will be described in the following. With regard to all other features it is referred to the above discussion of the first example. In particular, elements having the same reference sign shall refer to same elements having the same characteristics. The insulated gate power semiconductor device according to the fourth example is a vertical power MOSFET 10, which differs from the trench IGBT 1a shown in FIG. 1 in that it does not comprise the p-type collector layer 25 but comprises on the second main side 27 an (n+)-doped drain layer 95 between the drift layer 5 and the second main electrode 25. For the power MOSFET shown in FIG. 8, the first main electrode 2 forms a source electrode and the second main electrode 25 forms a drain electrode.

Figure 9A:
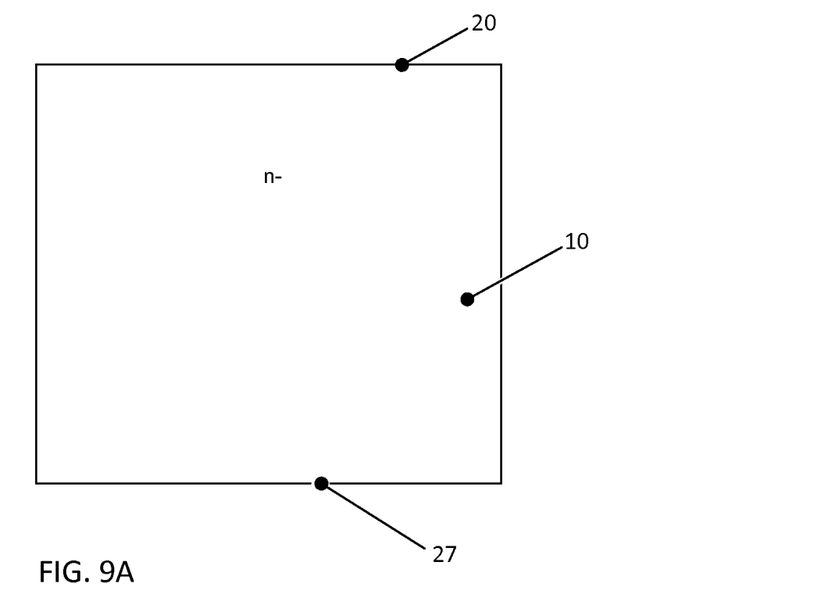
FIG. 9A to 9F illustrate different manufacturing steps a method for manufacturing the insulated gate power semiconductor device of FIG. 2.

In the following a method manufacturing an insulated gate trench power semiconductor device according the embodiment discussed above with reference to FIG. 2 is described with reference to FIGS. 9A to 9F. The method comprises the following steps:

In a step (a) as illustrated in FIG. 9A, an (n−)-type substrate 10 having a first main side 20 and second main side 27 opposite to the first main side 20 is provided, wherein the doping level of the substrate 10 is the same as that of the drift layer 5 in the finalized insulated gate power semiconductor device. Exemplarily, the substrate 10 may be made of silicon.

Figure 9B:
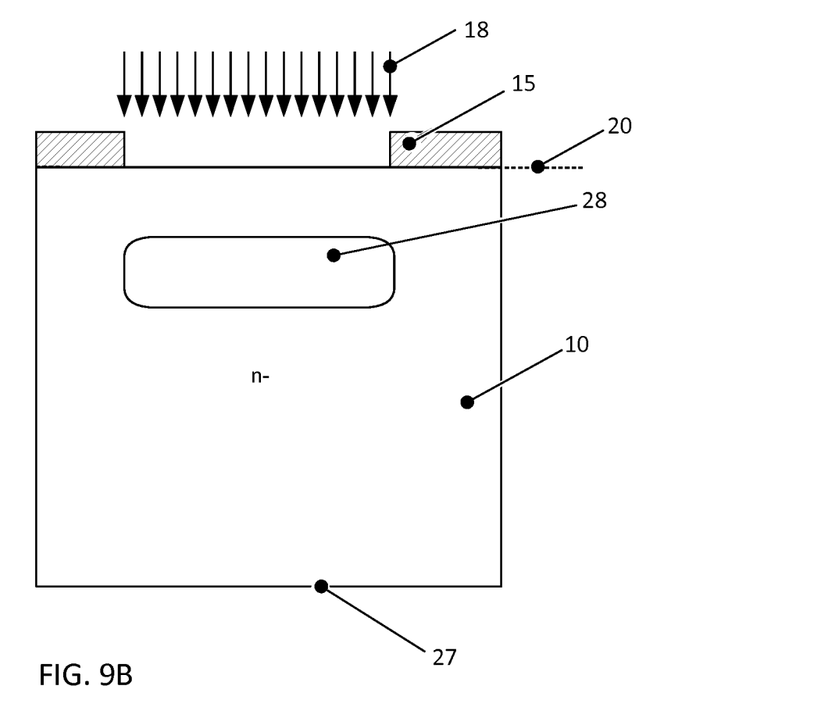
Figure 9C:
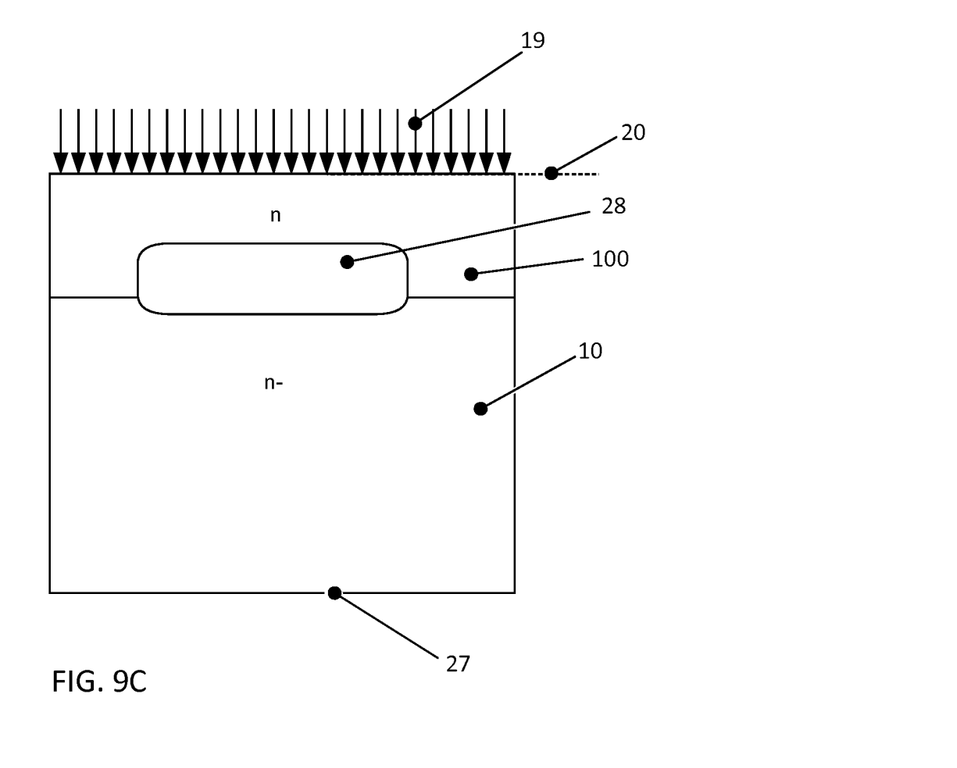

In a step (b) illustrated in FIG. 9B a p-type first dopant 18 is selectively implanted from the first main side 20 into the substrate 10. Exemplarily, the p-type dopant may be Boron.

An implantation mask 15 may be used for selectively implanting the first dopant into a region 28 at a predetermined depth as shown in FIG. 9B.

In a step (c), an n-type second dopant is applied and diffused or is implanted into the substrate 10 from the first main side 20 for creating the enhancement layer 6 and the channel layer 60b in the finalized device. The n-type second dopant is exemplarily Phosphorous. The elevated n-type doping concentration which is created in step (c) is shown as an n-type layer 100 in FIG. 9C. Its doping concentration is lower than that of region 28.

Figure 9D:
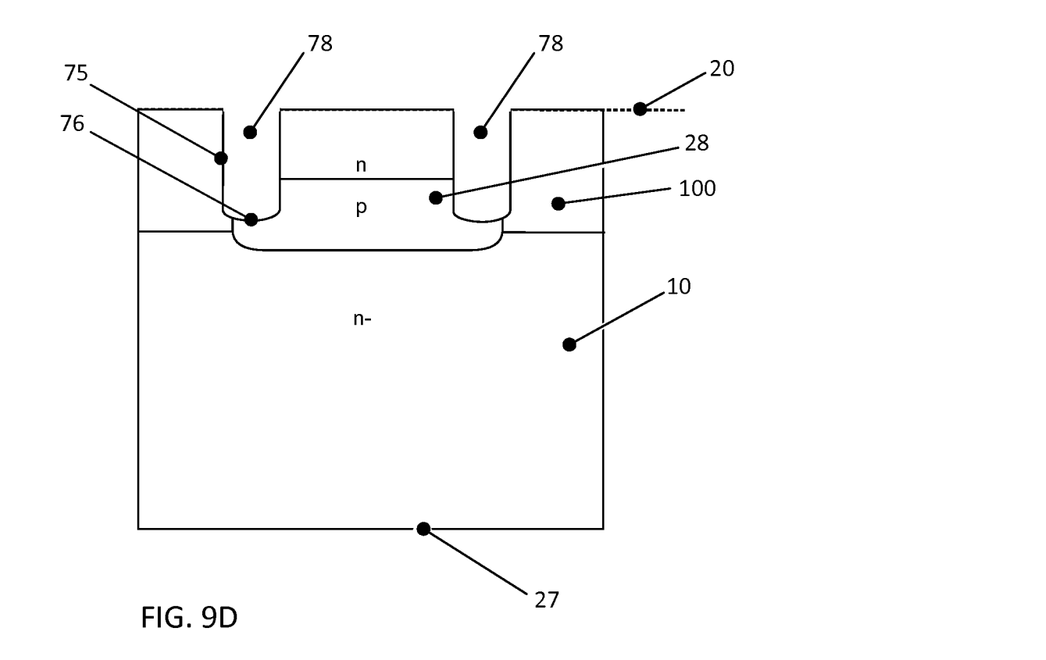

In a step (d) two neighbouring trench recesses 78 are formed in the substrate 10, wherein each of the trench recesses 78 extends from the first main side 20 into the substrate 10, and wherein each trench recess 78 has lateral sides 75 and a bottom 76 as shown in FIG. 9D. The trench recess 78 has exemplarily a depth between 2.5 μm and 10 μm. In the present embodiment each of the two neighbouring trench recesses 78 overlaps partially with the p-type region 28 in an orthogonal projection onto a plane parallel to the first main side 20 of the substrate 10. The trench recesses 78 penetrate into the region 28 so that a portion of the bottom 76 and a lower portion of the lateral sides 75 of trench recess 78 is directly adjacent to the region 28 as shown in FIG. 9D.

Figure 9E:
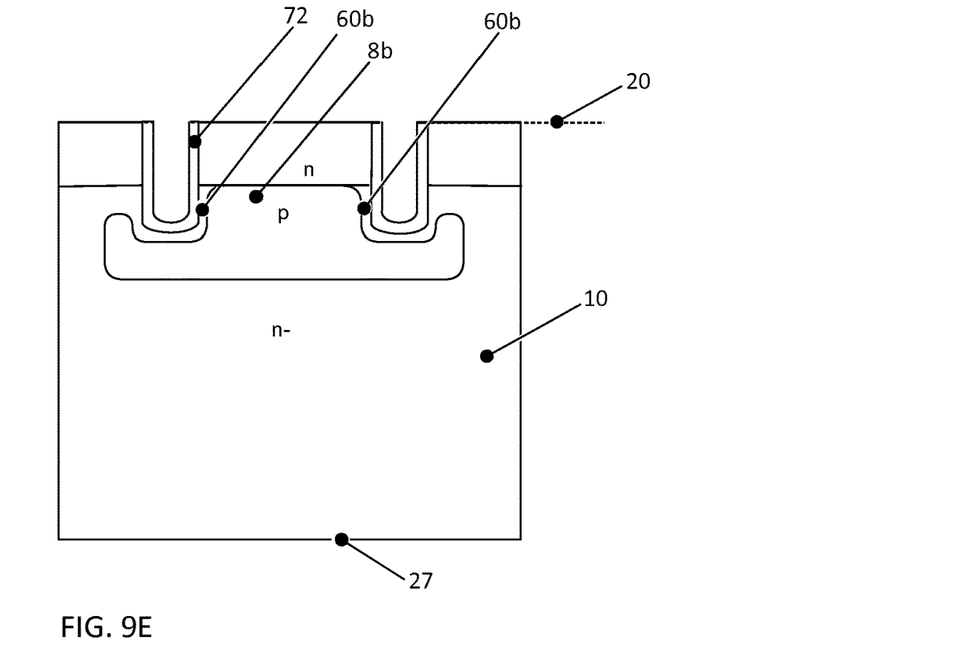
Figure 9F:
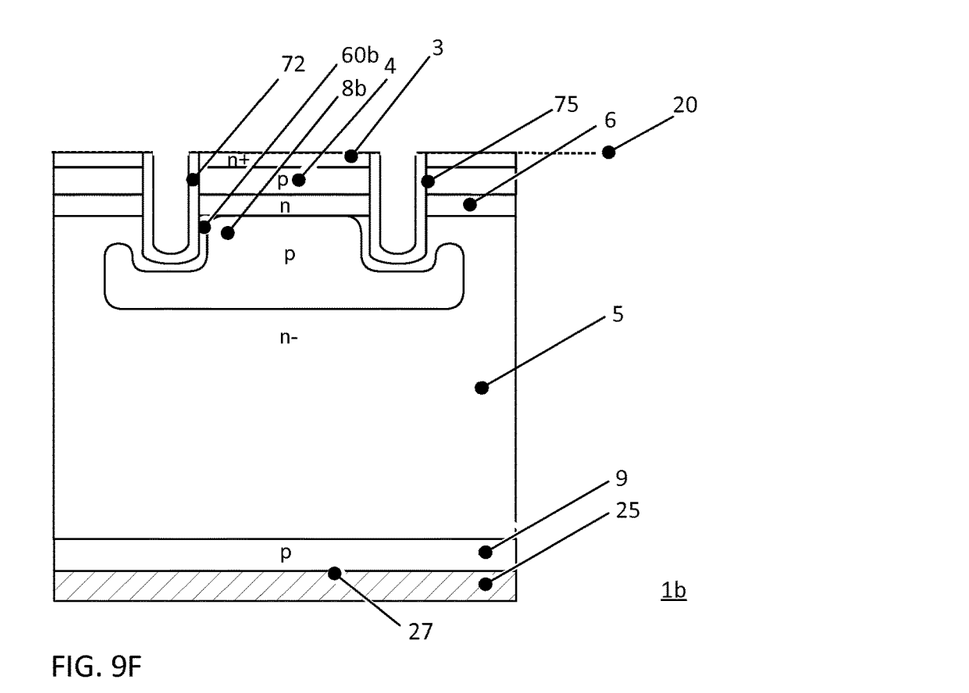

In a step (e) a gate insulating layer 72 is formed on the lateral sides 75 and on the bottom 76 of each trench recess 78 as shown in FIG. 9E. Exemplarily, the gate insulating layer 72 may be a gate oxide layer, in particular the gate insulating layer 72 may be made of silicon oxide. During or after step (e) of forming a gate insulating layer 72 a temperature of at least 900° C., exemplarily of at least 975° C., more exemplarily of at least 1050° C. is applied for at least one hour in total. With the heat energy input associated therewith, diffusion and segregation of the p-type dopant results in a reduction of the concentration of first dopants below the concentration of n-type dopant in areas directly adjacent to the trench recesses 78. This results in the creation of the n-type channel layer 60b by overcompensation as shown in FIG. 9E.

In a step (f), a p-type third dopant is applied and diffused or is implanted into the substrate 10 from the first main side 20 for forming the base layer 4 in the finalized insulated gate power semiconductor device.

In a step (g) an n-type forth dopant is applied and diffused or is implanted into the substrate (10) from the first main side (20) for forming the highly doped (n+)-type source layer 3 in the finalized insulated gate power semiconductor device. The step (g) is exemplarily performed after step (e). Afterwards, an etching step may be performed, by which in a central region between the two neighbouring gate electrodes 7, material is removed to a depth, in which the p-type dopant of the base layer 4 predominates to enable a contact from a later formed emitter electrode 2 to the base layer 4.

Depending on which specific insulated gate power semiconductor device is to be manufactured, the method may include additional method steps which are well known to the skilled person. For example for manufacturing a trench IGBT 1a, 1b, 1c or 1d as shown any one of FIG. 1, 2, 6 or 7, a p type dopant may be implanted from the second main side 27 and annealed for the creation of the collector layer 9. For manufacturing a PT trench IGBT 1c as shown in FIG. 6 an n-type dopant may be implanted from the second main side 27 into the substrate 10 and annealed for the creation of the buffer layer 55. For manufacturing the RC IGBT 1d as shown in FIG. 7 an n-type dopant may selectively be implanted into the collector layer 9 by using a mask, for example, and annealed to create the shorts 92 penetrating the collector layer 9. For manufacturing the power MOSFET 10 as shown in FIG. 8 an n-type dopant may be implanted from the second main side 27 into the substrate and the substrate 10 may be annealed to form the drain layer 95.

Further, trench recesses 80 are filled with electrically conductive material thereby forming the gate layer 70 such that the electrically insulating gate insulating layer 72 separates the gate layer 70 from the drift layer 5, the base layer 4 and the source layer 3. Thus, a trench gate electrode 7 is formed, which comprises the gate layer 70 and the gate insulating layer 72, wherein the trench gate electrode 7 is arranged laterally to the base layer 4 in a plane parallel to the first main side 22. Thereafter, a top gate insulating 74 is formed at least on the trench gate electrode 7.

Finally, an emitter electrode 2 is formed on the first main side 20, which contacts both, the base layer 4 and the source layer 3. On the second main side 27 a collector electrode 25 is formed, which contacts the doped layer on the second side 27, i.e. the collector layer 9 for the trench IGBT 1a, 1b, 1c and 1d as shown in FIGS. 1, 2, 6 and 7, for example, or the drain layer 95 for a power MOSFET 10 as shown in FIG. 8, for example.

Modifications and variations of the above described embodiments and examples may be possible.

The gate electrode 7 may have different designs like a stripe design, i.e. having in a plane parallel to the first main side 20 a short side and a long side perpendicular to the short side. The source layer 3 is arranged along the long sides of the gate electrode 7. Other designs for the trench gate electrode 7 are also possible like square design, circular design, ring design, hexagonal design, etc. The device may have two neighbouring trench gate electrodes 7 or it may comprise a more than two trench gate electrodes 7. Exemplarily, in the latter case the gate electrodes 7 are arranged in a regular geometrical design.

In all embodiments and examples, the conductivity types may be switched, i.e. all layers which are described above as n-type may be p type (e.g. the drift layer 5, the source layer 3, the enhancement layer 6, the buffer layer 55, shorts 92 and the channel layers 60a, 60b) and all layers which are described above to be p-type may be n-type (e.g. base layer 4, the collector layer 6 and the protection layers 8a and 8b).

In the embodiments and examples shown in the figures, a source layer 4 is formed only on one side of the trench gate electrodes 7, respectively. However, the source layer may be formed also on both sides of the gate electrodes 7. Also in some modified embodiments or examples, active MOS cells may be separated from each other by dummy cells or any other appropriate layer configuration or structure.

The order of steps in the method for manufacturing an insulated gate power semiconductor device is not limited to the indicated order of above discussed steps (a) to (f), but may be any other appropriate order. For, example, it is also possible to create the base and/or source layer 4, 3 at any other appropriate point in time during the manufacturing method, the base layer 4 may be created before or after the step (d) of forming trench recesses 78, for example, while the source layer 3 may be created at any time after the step (e) of forming a gate insulating layer 72.

It should be noted the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the scope of the invention as defined by the appended claims.

LIST OF REFERENCE SIGNS 1a trench insulated gate bipolar transistor (IGBT)
1b trench IGBT
1c punch-through (PT) IGBT
1d reverse conducting (RC) IGBT
10 trench power MOSFET
18 first dopant
100 trench IGBT
200 trench IGBT
2 first main electrode
20 first main side
25 second main electrode
27 second main side
28 region
3 source layer
4 base layer
5 drift layer
55 buffer layer
6 enhancement layer
60a, 60b channel layer
7 trench gate electrode
70 gate layer
72 gate insulating layer
74 top gate insulating layer
75 lateral side
76 bottom
77 trench depth
78 trench recess
8a protection layer
8b protection layer
80 (first) protection layer region
81 second protection layer region
85 line
9 collector layer
92 shorts
95 drain layer

The invention claimed is:

1. An insulated gate power semiconductor device, comprising:
- a source layer of a first conductivity type, wherein the first conductivity type is either n-type or p-type;
- a base layer of a second conductivity type, wherein the second conductivity type is different from the first conductivity type and wherein the base layer is in direct contact with the source layer to form a first pn junction;
- an enhancement layer of the first conductivity type that is in direct contact with the base layer to form a second pn junction;
- a drift layer of the first conductivity type, wherein the source layer, the base layer, the enhancement layer, and the drift layer are formed in an order from a first main side toward a second main side that is opposite to the first main side;
- two neighboring trench gate electrodes arranged at the first main side and extending in a direction toward the second main side, each of the two trench gate electrodes having an electrically conductive gate layer that is separated from the source layer, the base layer, the enhancement layer and the drift layer by a gate insulating layer to form a vertical MOS cell sandwiched between the two neighboring trench gate electrodes;
- a protection layer of the second conductivity type, at least a portion of the protection layer being arranged in an area between the two neighboring trench gate electrodes;
- wherein the protection layer is separated from the gate insulating layer by a channel layer of the first conductivity type extending along the gate insulating layer; and
- wherein the protection layer extends from the area between the two neighboring trench gate electrodes to a region below the neighboring trench gate electrodes so that the protection layer overlaps with the two neighboring trench gate electrodes in an orthogonal projection onto a plane parallel to the first main side.

2. The insulated gate power semiconductor device according to claim 1, wherein a maximum doping concentration of the protection layer is in a range from $5 \cdot 10^{15}$ cm$^{-3}$ to $1 \cdot 10^{17}$ cm$^{-3}$, or in a range from $5 \cdot 10^{15}$ cm$^{-3}$ to $5 \cdot 10^{16}$ cm$^{-3}$.

3. The insulated gate power semiconductor device according to claim 1, wherein a maximum doping concentration of the enhancement layer is higher than the maximum doping concentration of the protection layer.

4. The insulated gate power semiconductor device according to claim 1, wherein the first conductivity type is n-type and the second conductivity type is p-type.

5. The insulated gate power semiconductor device according to claim 1, wherein a maximum doping concentration of the enhancement layer is in a range from $4 \cdot 10^{16}$ cm$^{-3}$ to $4 \cdot 10^{17}$ cm$^{-3}$, or in a range from $1 \cdot 10^{17}$ cm$^{-3}$ to $4 \cdot 10^{17}$ cm$^{-3}$.

6. The insulated gate power semiconductor device according to claim 1, wherein the protection layer has, in the area between the two neighboring trench gate electrodes and along a line parallel to the first main side and crossing the two neighboring trench gate electrodes, a varied lateral doping profile that has a maximum concentration of a second conductivity type dopant in a central area between the two neighboring trench gate electrodes and that is decreasing from the maximum concentration to a minimum concentration of the second conductivity type dopant toward the two neighboring trench gate electrodes, respectively.

7. The insulated gate power semiconductor device according to claim 1, wherein the insulated gate power semiconductor device is an IGBT having a collector layer of the second conductivity type on the second main side or a reverse conducting IGBT having alternatingly a collector layer of the second conductivity type and shorts of the first conductivity type on the second main side or a MOSFET having a drain layer of the first conductivity type on the second main side.

8. A method for manufacturing the insulated gate power semiconductor device according to claim 1, the method comprising:
- (a) providing a substrate of the first conductivity type having a first main side and second main side opposite to the first main side, wherein a doping level of the substrate is the same as that of the drift layer in the finalized insulated gate power semiconductor device;
- (b) implanting a first dopant of a second conductivity type into the substrate from the first main side for forming the protection layer in the finalized insulated gate power semiconductor device;
- (c) applying and diffusing, or implanting a second dopant of the first conductivity type into the substrate from the first main side for forming the enhancement layer and the channel layer in the finalized insulated gate power semiconductor device;

(d) forming two neighboring trench recesses extending from the first main side into the substrate, each trench recess having trench lateral sides and a trench bottom;

(e) forming a gate insulating layer on the trench lateral sides and the trench bottom of each trench recess after having performed at least the steps (a), (b) and (d);

(f) applying and diffusing, or implanting a third dopant of the second conductivity type into the substrate from the first main side for forming the base layer in the finalized insulated gate power semiconductor device; and (g) applying and diffusing, or implanting a fourth dopant of the first conductivity type into the substrate from the first main side at least after step (e) for forming the source layer in the finalized insulated gate power semiconductor device;

wherein the first dopant of second conductivity type which is implanted in step (b) is diffused into the substrate and segregated into the gate insulating layer during and after step (e) to lower the concentration of the first dopant of the second conductivity type in an area adjacent to and extending along the gate insulating layer so that the channel layer separating the protection layer from the gate insulating layer is formed by the second dopant overcompensating the first dopant in the finalized insulated gate power semiconductor device.

9. The method according to claim 8, wherein the substrate is made of silicon and the gate insulating layer is made of silicon oxide.

10. The method according to claim 8, wherein the first dopant is boron.

11. The method according to claim 8, wherein the second dopant is phosphorus.

12. The method according to claim 8, wherein the trench recesses each have a depth between 2.5 µm and 10 µm.

13. The method according to claim 8, wherein during and after step (e) a temperature is applied for at least one hour in total, wherein the temperature is at least 900° C., or at least 975° C., or at least 1050° C.

* * * * *